United States Patent
Mermet-Guyennet

(10) Patent No.: US 6,625,024 B2
(45) Date of Patent: Sep. 23, 2003

(54) POWER CONVERTER ENCLOSURE

(75) Inventor: Michel Mermet-Guyennet, Aurensan (FR)

(73) Assignee: Alstom, Paris (FR)

( * ) Notice: Subject to any disclaimer, the term of this patent is extended or adjusted under 35 U.S.C. 154(b) by 0 days.

(21) Appl. No.: 10/188,089

(22) Filed: Jul. 3, 2002

(65) Prior Publication Data
US 2003/0117824 A1 Jun. 26, 2003

(30) Foreign Application Priority Data
Jul. 6, 2001 (FR) ............................................. 01 09007

(51) Int. Cl.[7] ................................................ H05K 7/20
(52) U.S. Cl. ................... 361/700; 165/104.33; 257/715
(58) Field of Search ................. 257/713–715, 257/722; 165/80.3, 80.4, 185, 104.33; 62/259.2; 174/16.3, 15.2; 363/141; 361/699, 700, 703, 704, 705, 707–712, 717–719

(56) References Cited

U.S. PATENT DOCUMENTS

| | | | |
|---|---|---|---|
| 3,741,292 A | * | 6/1973 | Aakalu et al. ......... 165/104.21 |
| 5,349,499 A | * | 9/1994 | Yamada et al. ............. 361/700 |
| 5,390,077 A | * | 2/1995 | Paterson |
| 5,404,272 A | | 4/1995 | Lebailly et al. |
| 5,969,950 A | * | 10/1999 | Tantoush ..................... 361/704 |
| 6,175,501 B1 | * | 1/2001 | Bortolini et al. ............ 361/720 |
| 6,212,074 B1 | | 4/2001 | Gonsalves et al. |
| 6,525,420 B2 | * | 2/2003 | Zuo et al. ................... 257/715 |

FOREIGN PATENT DOCUMENTS

| | | |
|---|---|---|
| DE | 4307902 C1 | 6/1994 |
| GB | 2076141 A | 11/1981 |

OTHER PUBLICATIONS

USPGPUB 2002/0056908 A1, filed May 16, 2002, Brownell et al.*

* cited by examiner

Primary Examiner—Gerald Tolin
(74) Attorney, Agent, or Firm—Sughrue Mion, PLLC

(57) ABSTRACT

A power converter enclosure, intended in particular to equip a rail vehicle traction system including power electronic modules comprising one or more power semiconductor components mounted on a substrate, includes a base including a bottom panel with double walls having an inside wall on the side toward the interior of the enclosure in contact with at least one substrate supporting a power component. The bottom panel is extended by at least two lateral panels with double walls whose outside walls are cooled by cooling fins. The two walls of the bottom panel delimit a hollow volume partly filled with a cooling liquid and containing a thermally conductive permeable material providing a thermal bridge between the two walls.

10 Claims, 3 Drawing Sheets

POWER CONVERTER ENCLOSURE

BACKGROUND OF THE INVENTION

1. Field of the Invention

The invention relates to an enclosure for a power converter intended for a rail vehicle traction system.

2. Description of the Prior Art

The performance of power electronic modules is known to be limited by the temperature reached by the power electronic components in operation due to heating caused by the dissipation of power by the Joule effect. The performance of a silicon chip is strongly degraded beyond 150° C., for example. Also, the reliability of power electronic components is strongly degraded above 100° C.

Because of this, it is very important to provide a cooling system to evacuate the heat generated, in order to maintain an optimum operating temperature in the components and thereby to be in a position to increase the power that can be used. In particular, with some components, such as IGBT, the maximum permitted current is a function of the quantity of heat that the device is capable of evacuating.

The solution most usually adopted on rail vehicles for cooling power modules used in the converters is to apply an aluminum heatsink with cooling fins to the base of each of the power modules, the combination of the modules and their heatsinks being disposed in an enclosure situated under the vehicle and open at the sides to enable a flow of air, especially when the vehicle is moving.

However, this solution has the drawback that the cooling of the power modules is not very effective, in particular when the vehicle is stationary and no flow of air is traveling over the heatsinks. This lack of cooling leads to the use of a greater number of power components, in order to reduce the current in each power component and therefore to reduce the heating thereof, which has the drawback of increasing the cost, overall size and weight of the power converters.

This problem can be partly solved by using fans to create a permanent flow of air over the heatsinks. However, fans have the drawback of generating a great deal of noise, of being somewhat unreliable, and of having a short service life in the rail environment.

The object of the present invention is therefore to propose an enclosure for power electronic modules that ensures excellent and highly reliable cooling of the power components within a small overall size, thereby reducing the number of power electronic modules needed to implement an inverter installation in a rail vehicle traction system.

SUMMARY OF THE INVENTION

To this end, the invention provides a power converter enclosure, intended in particular to equip a rail vehicle traction system including power electronic modules comprising one or more power semiconductor components mounted on a substrate, which enclosure includes a base including a bottom panel with double walls having an inside wall on the side toward the interior of the enclosure in contact with at least one substrate supporting a power component, the bottom panel being extended by at least two lateral panels with double walls whose outside walls are cooled by cooling fins, and in which enclosure the two walls of the bottom panel delimit a hollow volume partly filled with a cooling liquid and containing a thermally conductive permeable material providing a thermal bridge between the two walls.

Particular embodiments of the enclosure according to the invention can have one or more of the following features, in isolation or in any technically feasible combination:

the thermally conductive permeable material is a porous material such as copper foam injected into said hollow volume defined by the two walls;

the thermally conductive permeable material comprises a stack of copper or aluminum grids between the two walls;

the lateral panels have an accordion-shape outside wall defining said cooling fins;

the lateral panels have a plane outside wall to which said cooling fins are attached;

one or more passive components are in contact with the inside wall of the double-wall lateral panels;

a cover of complementary shape to the base closes said enclosure;

the bottom panel of the base has a plane outside wall;

the bottom panel of the base has an outside wall cooled by cooling fins; and the power components are IGBT.

The aims, aspects and advantages of the present invention are explained in the following description of embodiments of the invention, which is given by way of nonlimiting example and with reference to the accompanying drawings.

DETAILED DESCRIPTION OF THE PREFERRED EMBODIMENT

To make the drawings easier to read, only the items necessary to understanding the invention are shown. The same items are identified by the same reference numbers from one figure to another.

Figure 1:
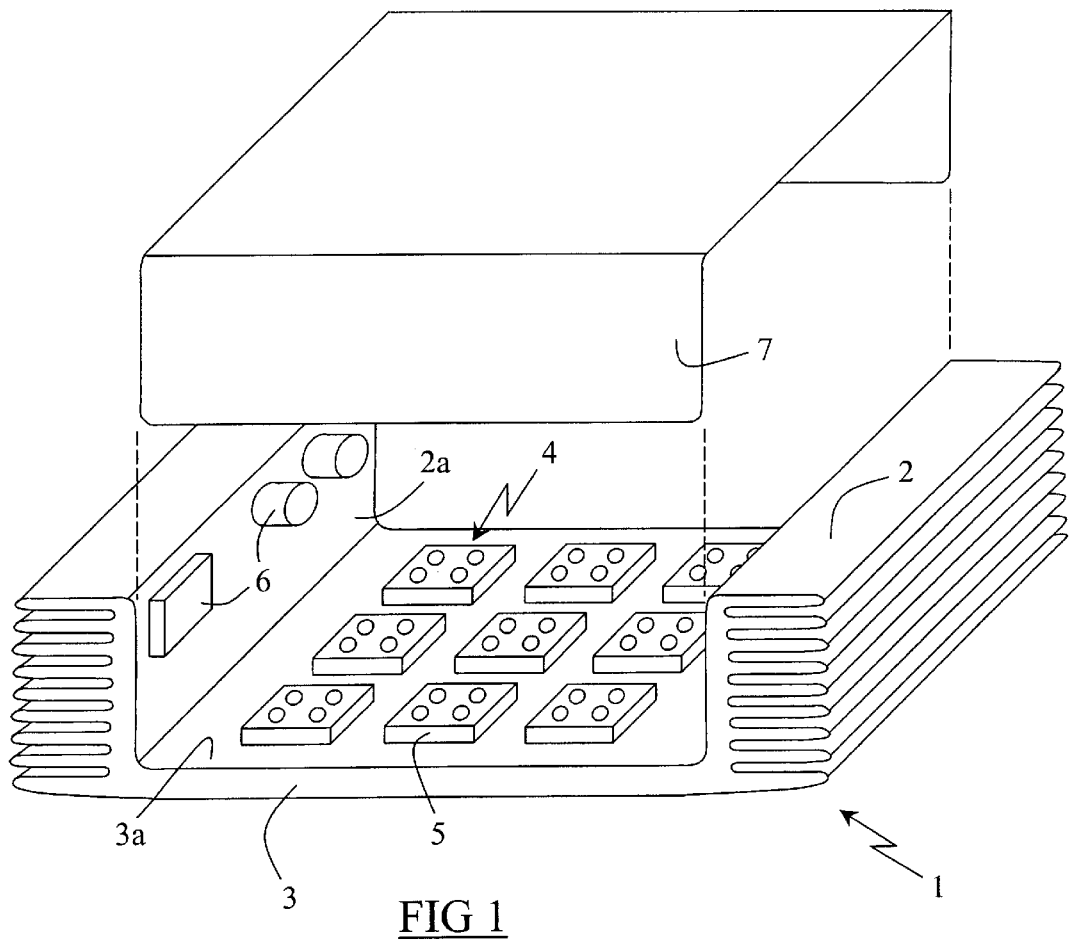
FIG. 1 is a perspective view of an enclosure for power electronic modules conforming to a first embodiment of the invention.

FIG. 1 shows an enclosure for a power converter for an underground railway train traction system.

As shown in the figure, the enclosure includes a base 1 with a bottom panel 3 having two walls 3a and 3b extended by two lateral panels 2 perpendicular to the bottom panel 3. The two lateral panels 2 also have two walls 2a and 2b and are symmetrical to the longitudinal plane through the center of the enclosure parallel to the lateral panels 2. The base 1 is preferably made from a metal that is a good conductor of heat.

The bottom panel 3 supports power modules 4 of the inverter on its inside wall 3a, facing toward the interior of the enclosure, each power module comprising one or more power components (IGBT) mounted on conductive tracks on a substrate 5 made of an electrically insulative material that is a good conductor of heat, such as aluminum nitride AlN, for example. The lower face of the substrate 5 is directly in contact with the inside wall 3a and soft-soldered to the base 1.

The inside wall 2a of the lateral panels 2 supports electronic components 6, which are preferably passive components, for example capacitors, which dissipate less heat then the power components integrated into the modules 4 on the bottom panel 3 of the base 1.

The outside wall 2b of each lateral panel 2 is accordion-shaped to form multiple cooling fins perpendicular to the lateral panel 2 for exchanging heat with the ambient air. The cooling fins are parallel to the axial direction of the underground railway train so that a flow of air sweeps over them when the train is moving.

The enclosure is closed by a cover 7 having a shape complementary to that of the base 1 and protecting the components 4, 6 inside the enclosure from external aggression.

Figure 2:
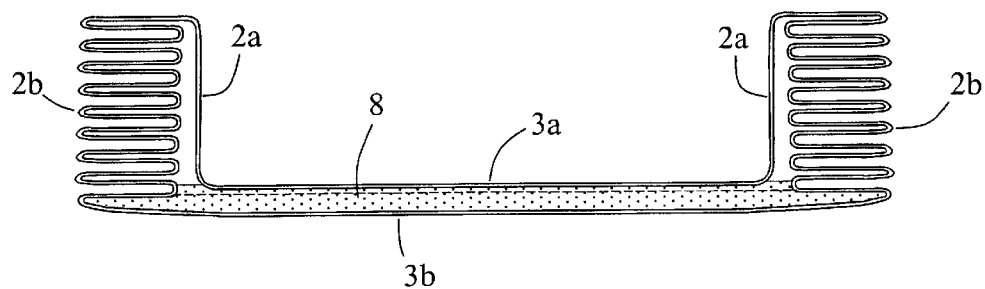
FIG. 2 is a view in cross section of a base of the enclosure from FIG. 1, shown on its own.

In FIG. 2, in which the base 1 is shown on its own, the bottom panel 3 has a hollow volume between the two walls 3a and 3b which is filled with a permeable material 8, such as copper foam, to ensure good conduction of heat between the inside wall 3a and the outside wall 3b of the bottom panel 3. The bottom panel 3 also contains a cooling liquid, such as water, partly filling the pores of the copper foam 8, the liquid level being shown in dashed line in FIG. 2. In a different embodiment, not shown, the permeable material 8 is a stack of grids, for example copper or aluminum grids, providing the same thermal bridge function between the inside wall 3a and the outside wall 3b.

The resulting base 1 constitutes a two-phase system in which the liquid contained in the copper foam 8 evaporates via pores when the temperature is increased by the operation of the various power components, the steam released in this way traveling through the lateral panels 2 and condensing on the outside wall 2b, on the cooling fins. The condensed and cooled liquid then drops back into the copper foam 8 of the bottom panel 3 and contributes to cooling the power modules on the inside wall 3a of the bottom panel 3.

The passive components on the lateral panels 2 are cooled by conduction via the inside wall 2a of the lateral panels 2.

Figure 3:
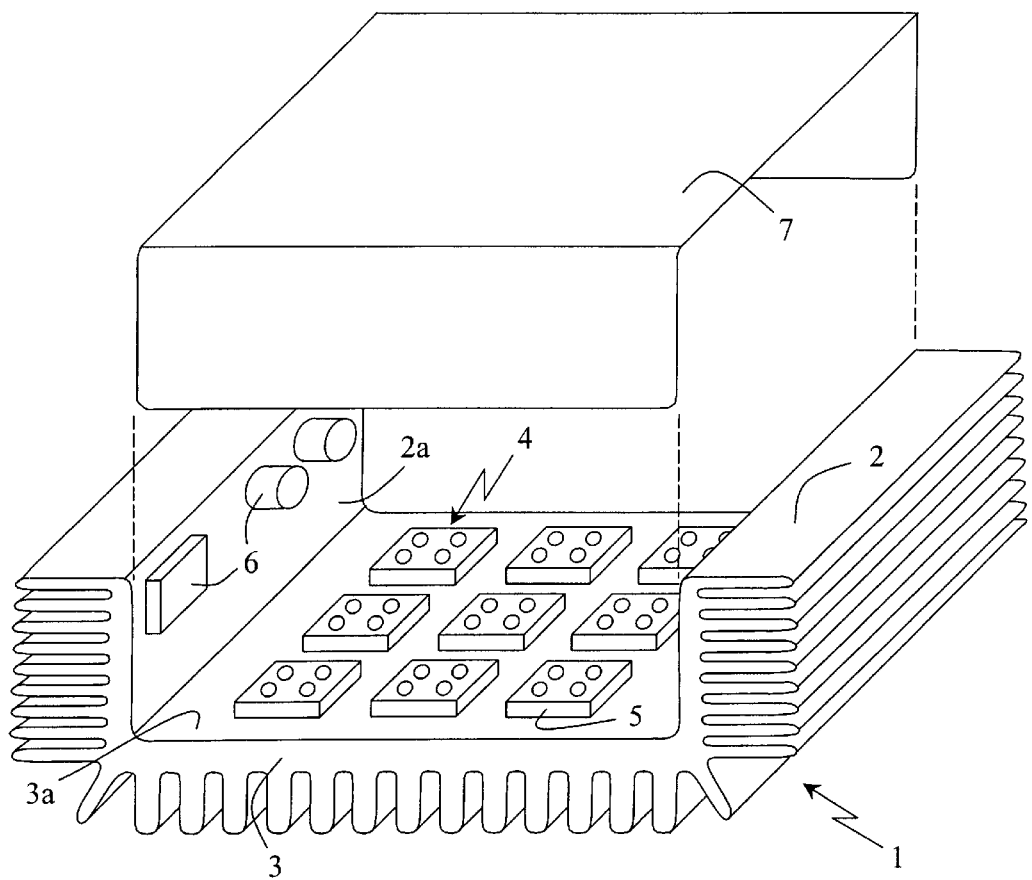
FIG. 3 is a perspective view of a different embodiment of an enclosure according to the invention.
Figure 4:
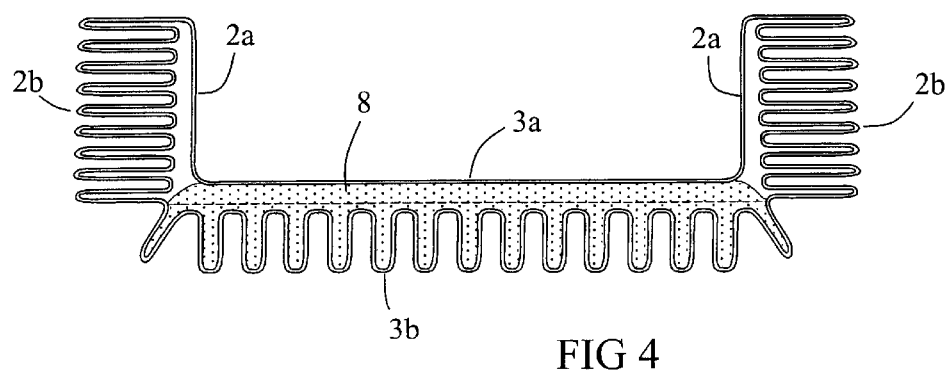
FIG. 4 is a view in cross section of a base of the enclosure from FIG. 3, shown on its own.

FIGS. 3 and 4 show a different embodiment of an enclosure according to the invention in which the bottom panel 3 of the base has an accordion-shape outside wall 3b forming multiple fins for reinforced cooling. In this embodiment, the lateral panels 2 of the base 1, the cover 7, the layout of the various power modules 4 and the passive components 6 remain unchanged compared to the embodiment previously described.

In FIG. 4, the bottom panel 3 is hollow and is filled with copper foam 8 which fills the interior of the cooling fins as well as the space between the inside wall 3a and the outside wall 3b to provide a thermal bridge between the two walls 3a and 3b. In a similar manner to the embodiment previously described, the porous material 8 is partly filled with a cooling liquid such as water, the level of the liquid being shown in dashed line in FIG. 4.

The above enclosure for a power converter constitutes a two-phase system functioning in an analogous manner to the enclosure shown in FIGS. 1 and 2, the cooling of the power components being further improved by the increased surface area of heat exchange.

Figure 5:
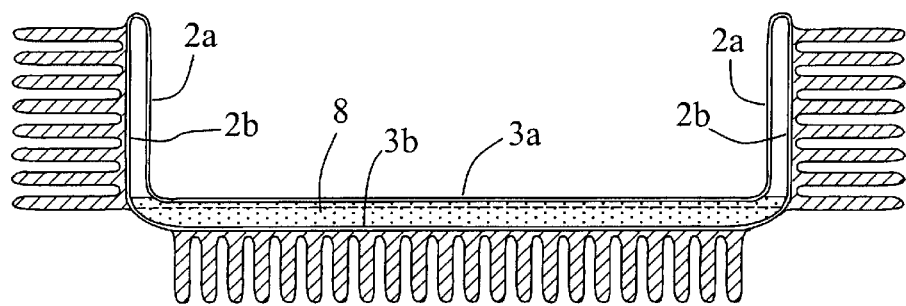
FIG. 5 is a view in section of a further embodiment of an enclosure according to the invention.

FIG. 5 shows a variant of the enclosure from FIG. 3 in which the outside walls 2b and 3b of the lateral panel 2 and the bottom panel 3 are flat and the cooling fins are attached to them, for example welded to them. The operation of this power converter enclosure remains unchanged compared to that of the enclosure shown in FIGS. 3 and 4. This embodiment has the advantage of simplifying fabrication of the enclosure.

Power converter enclosures according to the invention have the advantage of providing excellent protection of the power modules against external aggression by confining them in the enclosure, combined with very effective cooling.

Moreover, the cooling obtained by such enclosures remains equally effective when the vehicle is stationary, thanks to evaporation of the cooling liquid in the bottom panel of the base.

Of course, the invention is in no way limited to the embodiment described and shown, which has been provided by way of example only, and is open to modification, without departing from the scope of protection of the invention, in particular from the point of view of the composition of the various component parts or by substituting technical equivalents.

There is claimed:

1. A power converter enclosure, intended in particular to equip a rail vehicle traction system including power electronic modules comprising one or more power semiconductor components mounted on a substrate, which enclosure includes a base including a bottom panel with double walls having an inside wall on the side toward the interior of said enclosure in contact with at least one substrate supporting a power component, said bottom panel being extended by at least two lateral panels with double walls whose outside walls are cooled by cooling fins, and in which enclosure said two walls of said bottom panel delimit a hollow volume partly filled with a cooling liquid and containing a thermally conductive permeable material providing a thermal bridge between said two walls.

2. The power converter enclosure claimed in claim 1, wherein said thermally conductive permeable material is a porous material such as copper foam injected into said hollow volume defined by said two walls.

3. The power converter enclosure claimed in claim 1, wherein said thermally conductive permeable material comprises a stack of copper or aluminum grids between said two walls.

4. The power converter enclosure claimed in claim 1, wherein said lateral panels have an accordion-shape outside wall defining said cooling fins.

5. The power converter enclosure claimed in claim 1, wherein said lateral panels have a plane outside wall to which said cooling fins are attached.

6. The power converter enclosure claimed in claim 1, wherein one or more passive components are in contact with said inside wall of said double-wall lateral panels.

7. The power converter enclosure claimed in claim 1, wherein a cover of complementary shape to said base closes said enclosure.

8. The power converter enclosure claimed in claim 1, wherein said bottom panel of said base has a plane outside wall.

9. The power converter enclosure claimed in claim 1, wherein said bottom panel of said base has an outside wall cooled by cooling fins.

10. The power converter enclosure claimed in claim 1, wherein said power components are IGBT.

* * * * *